(12) United States Patent
Brenner et al.

(10) Patent No.: US 7,071,025 B2
(45) Date of Patent: Jul. 4, 2006

(54) SEPARATING WAFERS COATED WITH PLASTIC FILMS

(75) Inventors: Michael F. Brenner, Dallas, TX (US); Vincent C. Lopes, Lucas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 529 days.

(21) Appl. No.: 10/038,813

(22) Filed: Dec. 31, 2001

(65) Prior Publication Data

US 2002/0122894 A1 Sep. 5, 2002

Related U.S. Application Data

(60) Provisional application No. 60/259,032, filed on Dec. 29, 2000.

(51) Int. Cl.
H01L 21/48 (2006.01)
H01L 21/31 (2006.01)

(52) U.S. Cl. .................... 438/106; 438/761

(58) Field of Classification Search ............ 438/758, 438/114, 465, 460, 106, 107, 109, 761, 118, 438/780

See application file for complete search history.

(56) References Cited

U.S. PATENT DOCUMENTS

| | | | |
|---|---|---|---|
| 5,061,049 A | 10/1991 | Hornbeck | |
| 5,583,688 A | 12/1996 | Hornbeck | |
| 6,335,224 B1 * | 1/2002 | Peterson et al. | 438/114 |
| 6,401,545 B1 * | 6/2002 | Monk et al. | 73/756 |
| 2002/0012744 A1 * | 1/2002 | Miller et al. | 427/58 |
| 2002/0135864 A1 * | 9/2002 | Chiu et al. | 359/318 |

OTHER PUBLICATIONS

U.S. Appl. No. 10/036,698, filed Dec. 31, 2001, Jacobs.
U.S. Appl. No. 10/038,791, filed Dec. 31, 2001, Kaeriyama.

* cited by examiner

*Primary Examiner*—Howard Weiss
*Assistant Examiner*—(Vikki) Hoa B. Trinh
(74) *Attorney, Agent, or Firm*—Charles A. Brill; Wade James Brady, III; Frederick J. Telecky, Jr.

(57) ABSTRACT

The method of protecting micromechanical structures during a wafer fabrication process. A protective layer 402 is deposited to protect the fragile microstructures during a wafer separation process and a post separation cleanup process. Suitable protective layers 402 typically are plastic and tend to deform or delaminate when the wafer is sawn. The deformation of the protective overcoat during the saw process destroys the structures it is intended to protect. To prevent deformation of the protective layer 402, a brittle layer 404 is deposited on the protective layer 402 to hold the protective layer in place during the saw process. Cured photoresist is a suitable protective layer. The photoresist can be applied to the protective layer using standard processes and cured, typically by baking the photoresist. Once the wafer is separated, the brittle layer may be removed. After the debris created during the saw process is removed, the protective overcoat may be removed. The brittle layer 404 and the protective overcoat 402 may be removed at the same time. The preceding abstract is submitted with the understanding that it only will be used to assist in determining, from a cursory inspection, the nature and gist of the technical disclosure as described in 37 C.F.R. § 1.72(b). In no case should this abstract be used for interpreting the scope of any patent claims.

23 Claims, 3 Drawing Sheets

SEPARATING WAFERS COATED WITH PLASTIC FILMS

This application claims priority under 35 USC § 119(e)(1) of provisional application number 60/259,032 filed Dec. 29, 2000.

CROSS-REFERENCE TO RELATED APPLICATIONS

The following patents and/or commonly assigned patent applications are hereby incorporated herein by reference:

| Pat. No. | Filing Date | Issue Date | Title |
|---|---|---|---|
| 5,061,049 | Sep. 13, 1990 | Oct. 29, 1991 | Spatial Light Modulator and Method |
| 5,583,688 | Dec. 21, 1993 | Dec. 10, 1996 | Multi-Level Digital Micromirror Device |
| TI-28885 | Herewith | | Micromechanical Device Recoat Methods |
| TI-29135 | Herewith | | Micromechanical Device Recoat Methods |

FIELD OF THE INVENTION

This invention relates to the field of micromechanical device manufacture, more particularly to methods and systems for separating wafers on which micromechanical devices have been formed.

BACKGROUND OF THE INVENTION

Micromechanical devices are small structures typically fabricated on a semiconductor wafer using techniques such as optical lithography, doping, metal sputtering, oxide deposition, and plasma etching which have been developed for the fabrication of integrated circuits.

Micromirror devices are a type of micromechanical device. Other types of micromechanical devices include accelerometers, pressure and flow sensors, gears and motors. While some micromechanical devices, such as pressure sensors, flow sensors, and micromirrors have found commercial success, other types have not yet been commercially viable.

Micromirrors primarily are used in optical display systems. In display systems, the micromirror is a light modulator that uses digital image data to modulate a beam of light by selectively reflecting portions of the beam of light to a display screen. While analog modes of operation are possible, micromirrors typically operate in a digital bistable mode of operation and as such are the core of the first true digital full-color image projection systems.

Micromirrors have evolved rapidly over the past ten to fifteen years. Early devices used a deformable reflective membrane which, when electrostatically attracted to an underlying address electrode, dimpled toward the address electrode. Schlieren optics illuminate the membrane and create an image from the light scattered by the dimpled portions of the membrane. Schlieren systems enabled the membrane devices to form images, but the images formed were very dim and had low contrast ratios, making them unsuitable for most image display applications.

Later micromirror devices used flaps or diving board-shaped cantilever beams of silicon or aluminum, coupled with dark-field optics to create images having improved contrast ratios. Flap and cantilever beam devices typically used a single metal layer to form the top reflective layer of the device. This single metal layer tended to deform over a large region, however, which scattered light impinging on the deformed portion. Torsion beam devices use a thin metal layer to form a torsion beam, which is referred to as a hinge, and a thicker metal layer to form a rigid member, or beam, typically having a mirror-like surface: concentrating the deformation on a relatively small portion of the micromirror surface. The rigid mirror remains flat while the hinges deform, minimizing the amount of light scattered by the device and improving the contrast ratio of the device.

Recent micromirror configurations, called hidden-hinge designs, further improve the image contrast ratio by fabricating the mirror on a pedestal above the torsion beams. The elevated mirror covers the torsion beams, torsion beam supports, and a rigid yoke connecting the torsion beams and mirror support, further improving the contrast ratio of images produced by the device.

While there has been a rapid advance in the complexity and function of the micromirror array and a corresponding improvement in micromirror-based display systems, there are several micromirror manufacturing processes that continue to add a great deal of expense to the micromirror. In particular, some types of micromechanical devices are extremely sensitive to particles. Unfortunately, this particles are very difficult to remove since the devices are very fragile and cannot be exposed to typical clean-up processes such as a water or air scrub. Because the wafer separation process generates many of the particles, the devices are sometimes separated and washed prior to completing the device fabrication. This forces the remaining processing steps to be completed on individual devices—greatly driving up the cost of processing.

One process used to manufacture micromirror devices separates a wafer into individual die and mounts the die in the device package. After the die has been mounted, it is undercut removing the sacrificial layers of photoresist on which the mirrors have been formed. While this improves the manufacturing yield of the devices since the particle risk is greatly reduced, it does not realize the full cost savings of the higher yield since the nonfunctional parts are mounted in the fairly expensive package prior to testing.

What is needed is a process that enables micromechanical devices to be fully tested prior to wafer separation, yet enables the devices to be protected.

SUMMARY OF THE INVENTION

Objects and advantages will be obvious, and will in part appear hereinafter and will be accomplished by the present invention which provides a method and system for sawing wafers coated with a plastic layer. One embodiment of the invention provides a method of fabricating a micromechanical structure, the method comprising: fabricating at least two micromechanical structures on a substrate; overcoating the micromechanical structures with a protective layer; overcoating the protective layer with a brittle layer; and sawing said brittle layer and said protective layer. The process is especially well suited for the manufacture of micromirror devices and arrays. The brittle layer limits delamination or deformation of the overcoat layer during the wafer separation or saw process protecting the microstructures encased in the overcoat layer from damage.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF THE PREFERRED EMBODIMENTS

A new process has been developed to enable a wafer of micromechanical devices on which a protective overcoat has been formed to be diced without delaminating the protective overcoat which would destroy the micromechanical devices. This process is necessary to implement new processes that allow devices to be tested in wafer form and then coated to protect the micromechanical devices during the wafer separation process.

Figure 1:
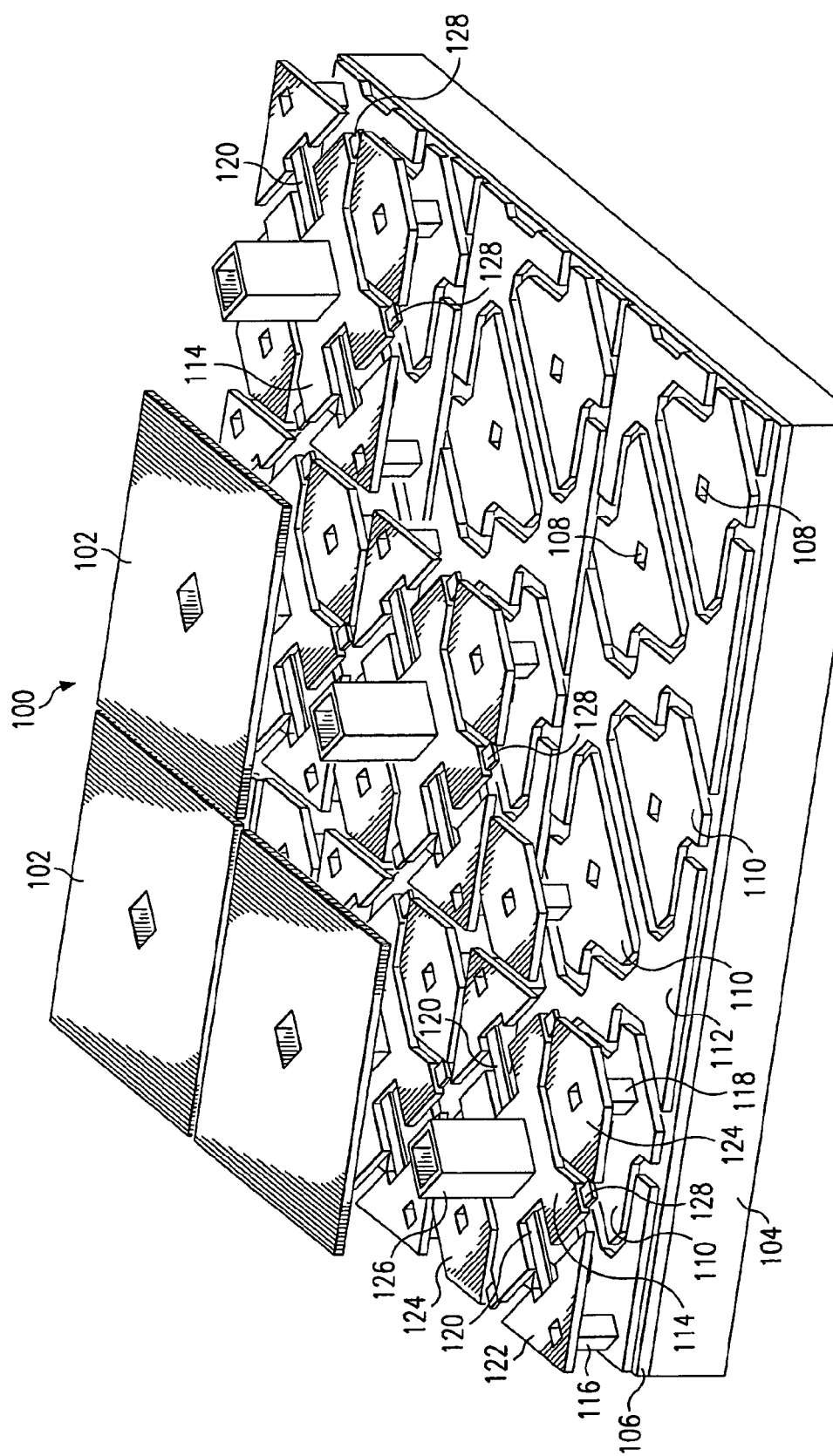
FIG. 1 is a perspective view of a small portion of a micromirror array of the prior art.
Figure 2:
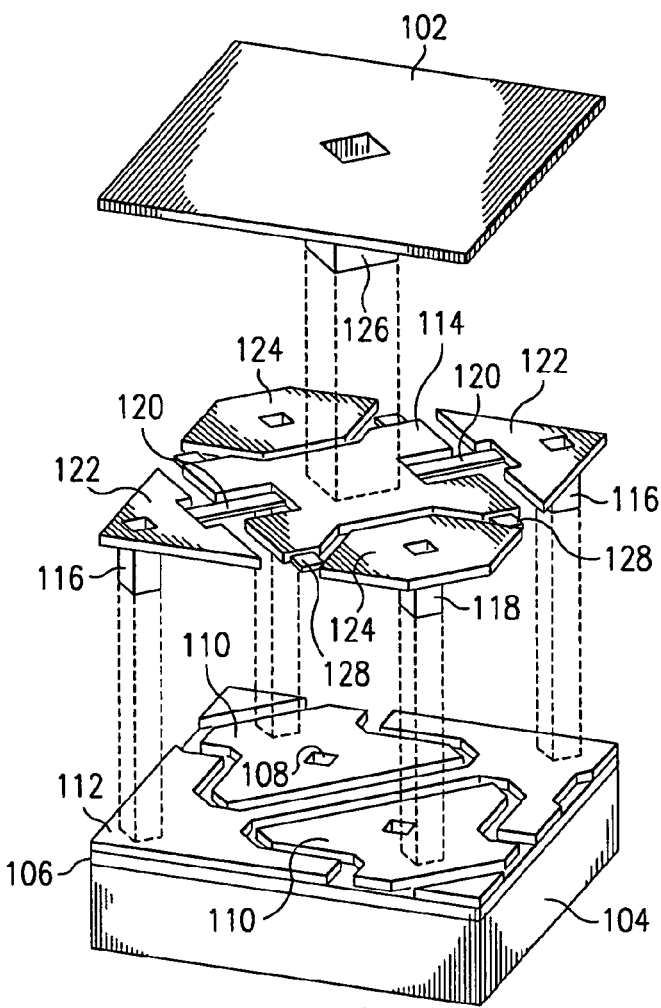
FIG. 2 is an exploded perspective view of a single micromirror element from the micromirror array of FIG. 1.

The disclosed process is useful for efficient fabrication of micromechanical devices. The process enables fragile components of micromechanical devices to be protected throughout the fabrication process. One type of micromechanical device is the micromirror array. A typical hidden-hinge micromirror array 100 is an orthogonal array of micromirror cells, or elements. This array often includes more than a thousand rows and columns of micromirrors. FIG. 1 shows a small portion of a micromirror array of the prior art with several mirrors 102 removed to show the underlying mechanical structure of the micromirror array. FIG. 2 is an exploded view of a single micromirror element of the prior art further detailing the relationships between the micromirror structures.

A micromirror is fabricated on a semiconductor, typically silicon, substrate 104. Electrical control circuitry is typically fabricated in or on the surface of the semiconductor substrate 104 using standard integrated circuit process flows. This circuitry typically includes, but is not limited to, a memory cell associated with, and typically underlying, each mirror 102 and digital logic circuits to control the transfer of the digital image data to the underlying memory cells.

An insulating layer 106, typically an oxide layer, separates the silicon substrate 104 and any metal interconnection layers from the micromirror superstructure. Holes, or vias, are opened in the oxide layer to allow electrical connection of the micromirror superstructure with the electronic circuitry formed in the substrate 104. Address electrodes 110 and a mirror bias connection 112 are formed from a metal layer deposited on the insulating layer 106.

Hinge support spacervias 116 and upper address electrode spacervias 118, typically extend approximately 1 μm above the address electrodes 110 and mirror bias connections 112. A hinge cap 122 and upper address electrodes 124 are supported by the hinge support spacervias 116 and upper address electrode spacervias 118. The hinge cap 122 anchors the ends of torsion hinges 120. A hinge yoke 114 is formed between and supported by the torsion hinges 120. The hinge yoke 114 is allowed to rotate by twisting the thin torsion hinges 120. A mirror support spacervia 126 is formed on the hinge yoke, and supports a mirror 102 approximately 2 μm above the hinge yoke 114.

The micromirror array 100 is operated using electrostatic attraction between an address electrode 110 and the hinge yoke 114 or mirror 102, which in effect form the two plates of an air gap capacitor, to rotate the mirror structure. During fabrication, the hinges yoke 114 and mirror 102 are supported by sacrificial spacer layers. These spacer layers typically are deep UV hardened photoresist layers on which the superstructure is formed. Prior to removal of the spacer layers, a wafer of micromirror devices is relatively durable and is able to be cleaned using a water scrub process to remove any particles created during fabrication. The micromirror devices, however, cannot be functionally tested at this point since the two spacer layers block movement of the micromirror.

Once the two spacer layers have been removed, the mirror is free to rotate about the axis formed by the torsion hinge and the device can be tested. Unfortunately, after the spacer layers have been removed, the device is extremely fragile and cannot be subjected to streams of air or water or other cleaning methods. Additionally, the devices are extremely sensitive to particulate contamination. Since the wafer separation process creates large quantities of particles, a wafer of micromirror devices typically must be diced, or separated into individual devices, and the separated devices washed, prior to removal of the spacer layers.

Figure 3:
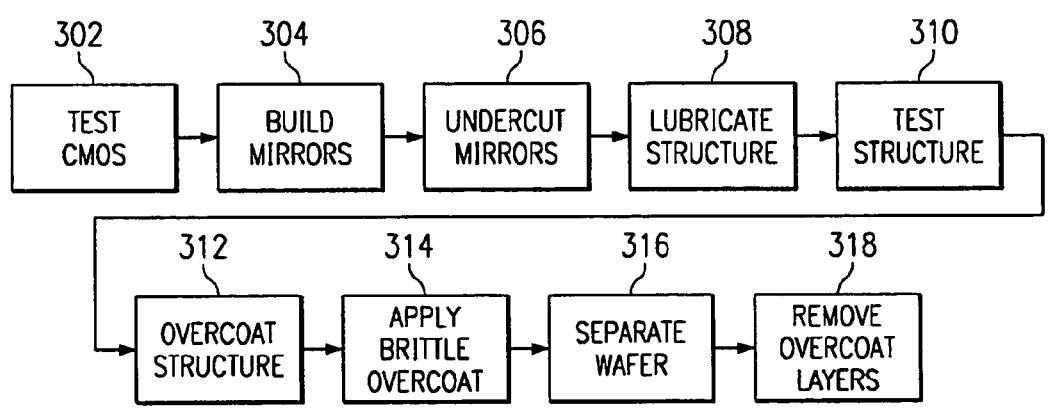
FIG. 3 is a block diagram showing the steps of a new process for separating wafers coating with plastic films.

A new micromechanical device overcoat process has been developed that allows the micromirror to be undercut, functionally tested, and then covered with a protective layer prior to wafer separation. FIG. 3 is a block diagram showing the steps of this new process. The process begins in block 302 where the addressing circuitry on the CMOS substrate on which the micromechanical devices will be fabricated is electrically tested using a standard probe tester. The testing process records the results of the testing so that the failed devices are not packaged at the completion of the process.

The micromechanical structures are fabricated on the wafer in step 304. For purposes of illustration, and not for limitation, the micromechanical structures will be assumed to be micromirror arrays. The processes described herein can be applied to any other micromechanical structure, including standard electrical interconnections formed on integrated circuits.

Any spacer layers on which the micromechanical structures have been built are removed in an undercut process 306. If necessary, the micromechanical structures are lubricated 308 to prevent the moving parts from sticking during the functional test 310 process. Once again, the results of the testing are stored for later reference so that the devices that fail either the CMOS or functional tests are not packaged. If necessary, the lubricant is removed prior to the application of a protective overcoat 312.

The protective layer protects the fragile components of the micromechanical device during the saw process 316. The protective overcoat prevents wafer particles from entering the mirror array and blocking the movement of the mirrors, and in the case of micromirror arrays, prevents wafer particles from scratching the surface of the mirrors. Once the devices are separated from the wafer, the protective layer prevents damage to the micromechanical structures while the wafer particles are washed from the surface of the device. After the debris is cleaned from the surface, the devices that tested good are mounted in packages and the protective layer is removed 318.

The materials used to form this overcoat and the manner in which the overcoat is deposited must be carefully selected to ensure the micromechanical structure is not damaged. This is particularly challenging when fabricating micromirror devices due to the relatively large mirror and weak structures. The large mirror size makes it susceptible to damage due from capillary action as the mirror array is wetted with the overcoat material and as solvents in the overcoat material evaporate.

Useful overcoat materials include layers deposited from hexafluorpropylene oxide, p-xylylene polymer, vinylic hydrocarbons, fluorocarbons and fluorocarbon polymers, coatings of acrylate monomers or oligomers, urethane acrylate resins, epoxy acrylate resins, and other polymer resins. One suitable material is sold under the trade name PARYLENE™. These materials may be applied to the surface of the micromechanical device by vapor deposition, immersion, or by depositing them in liquid form directly on the surface, typically during a spin-coating process or a spray coating process. The overcoat may completely fill voids under the structures—for example underneath the micromirrors—or the overcoat may simply seal over the top of the device. If necessary, the overcoat material is cured, using ultraviolet or thermal energy or simply by allowing a solvent to evaporate.

One unforeseen problem encountered in the overcoat process is the inability to saw the overcoated wafer. The materials that are suitable for overcoating the wafers are easily sawn, but they are slightly plastic and tend to deform and delaminate during the saw process. The deformation of the overcoat layer can destroy the very micromechanical structures the overcoat is trying to protect.

To prevent this deformation and delamination, a brittle overcoat layer is applied to the wafer over the top of the protective overcoat layer. This brittle layer prevents the more pliable overcoat layer from deforming or delaminating during the wafer saw process. Thus, the plastic overcoat layer is held in place by a brittle layer, avoiding damage to the micromechanical structure.

Figure 4:
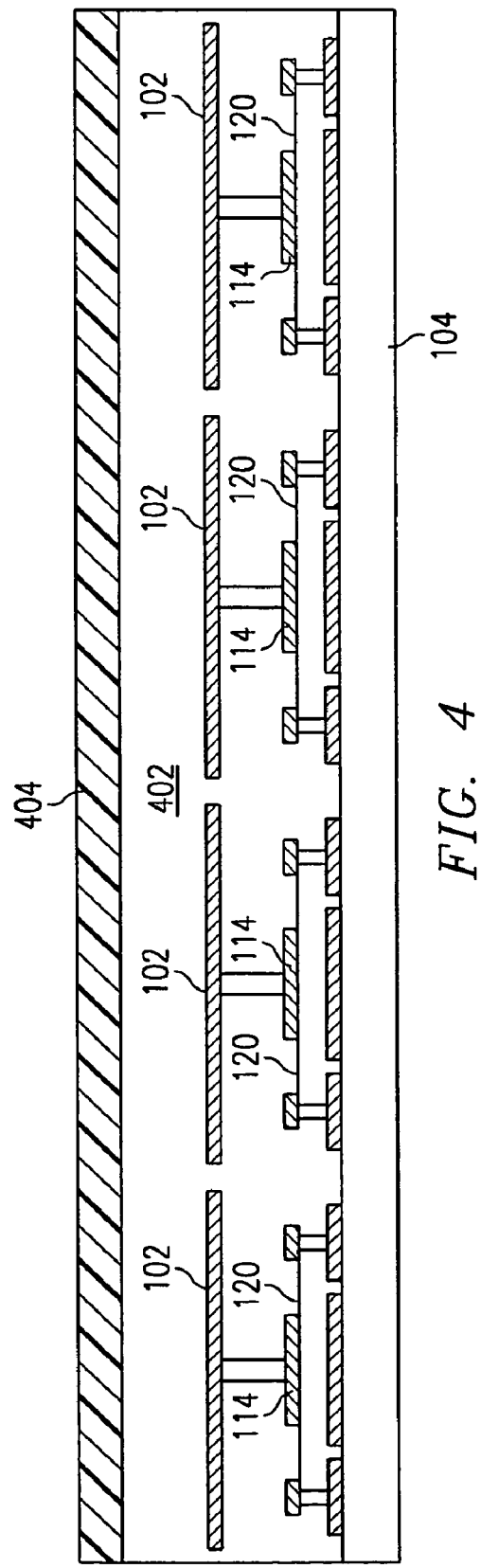
FIG. 4 is a cross section side view of a micromirror array showing the protective overcoat and brittle saw layers according to one embodiment of the present invention.

FIG. 4 is a cross section side view of a micromirror array showing the various layers described above. In FIG. 4, a layer of overcoat material 402 has been applied to the micromirror array. The overcoat material 402 has filled in beneath the micromirrors 102 and has been cured to provide a layer strong enough to prevent damage to the array during the wafer separation and cleanup processes. The overcoat layer 402 typically is between 1 and 10 µm thick.

A thin brittle layer 404 has been added to the top of the overcoat layer 402 to prevent the overcoat layer from delaminating or deforming during the wafer separation process. The thin brittle layer 404 allows the use of a thinner overcoat layer. A suitable material for the thin brittle layer 404 is standard photoresist. The photoresist is cured, typically by baking, after being spun onto the wafer. Once the brittle layer is cured, the wafer can be separated. The separated micromechanical devices are then cleaned, mounted in package substrates, and the brittle layer 404 and protective overcoat 402 removed. Since the two layers are different materials, it may be advantageous to remove the brittle layer 404 and the protective overcoat layer 402 separately.

Thus, although there has been disclosed to this point a particular embodiment for separating wafers coated with plastic films, it is not intended that such specific references be considered limitations upon the scope of this invention except insofar as set forth in the following claims. Furthermore, having described the invention in connection with certain specific embodiments thereof, it is to be understood that further modifications may now suggest themselves to those skilled in the art, it is intended to cover all such modifications as fall within the scope of the appended claims. In the following claims, only elements denoted by the words "means for" are intended to be interpreted as means plus function claims under 35 U.S.C. § 112, paragraph six.

What is claimed is:

1. A method of fabricating a micromechanical structure, the method comprising:
    fabricating at least two micromechanical structures on a substrate;
    overcoating said micromechanical structures with a protective layer;
    overcoating said protective layer with a brittle layer; and
    sawing said brittle layer and said protective layer.

2. The method of claim 1, said fabricating comprising fabricating at least two micromechanical devices on a semiconductor substrate.

3. The method of claim 1, said fabricating comprising fabricating at least two micromirror devices on said substrate.

4. The method of claim 1, said fabricating comprising fabricating at least two micromirror devices on a semiconductor substrate.

5. The method of claim 1, said fabricating comprising fabricating at least two micromirror arrays on said substrate.

6. The method of claim 1, said fabricating comprising fabricating at least two micromirror arrays on a semiconductor substrate.

7. The method of claim 1, said overcoating with a protective layer comprising overcoating with a plastic layer.

8. The method of claim 1, said overcoating with a protective layer comprising overcoating with a polymer resin.

9. The method of claim 1, said overcoating with a protective layer comprising overcoating with a PARYLENE layer.

10. The method of claim 1, said overcoating with a protective layer comprising overcoating with a acrylate monomer layer.

11. The method of claim 1, said overcoating with a protective layer comprising overcoating with a acrylate oligomer layer.

12. The method of claim 1, said overcoating with a protective layer comprising applying a protective overcoat by vapor deposition.

13. The method of claim 1, said overcoating with a protective layer comprising applying a protective overcoat by immersing said substrate in a liquid protective overcoat material.

14. The method of claim 1, said overcoating with a protective layer comprising applying a protective overcoat by spinning-on a protective overcoat layer.

15. The method of claim 1, comprising;
    thermally curing said protective layer.

16. The method of claim 1, comprising:
    curing said protective layer using ultraviolet light.

17. The method of claim 1, said overcoating with a brittle layer comprising overcoating with a photoresist layer.

18. The method of claim 1, said overcoating with a brittle layer comprising overcoating with a photoresist layer, further comprising:
    baking said photoresist layer.

19. The method of claim 1, said overcoating with a brittle layer comprising overcoating with a photoresist layer, further comprising:
deep UV hardening said photoresist layer.

20. The method of claim 1, said overcoating with a brittle layer comprising overcoating with a brittle layer to prevent said protective layer from delaminating from said substrate.

21. The method of claim 1, said sawing comprising sawing through said protective and overcoat layers.

22. The method of claim 1, said sawing comprising sawing through said protective and overcoat layers and said substrate to separate said micromechanical devices.

23. The method of claim 1, said sawing comprising sawing through said protective and overcoat layers and partially through said substrate layer.

* * * * *